US006771222B1

(12) United States Patent
Rosenbaum

(10) Patent No.: US 6,771,222 B1
(45) Date of Patent: Aug. 3, 2004

(54) PHASE-ARRAY ANTENNA DIPLEXING

(76) Inventor: Glen Var Rosenbaum, 10601 S. Pionciana Rd., Gilbert, AZ (US) 85234

( * ) Notice: Subject to any disclaimer, the term of this patent is extended or adjusted under 35 U.S.C. 154(b) by 0 days.

(21) Appl. No.: 10/456,760

(22) Filed: Jun. 6, 2003

Related U.S. Application Data

(62) Division of application No. 09/944,781, filed on Aug. 30, 2001, now Pat. No. 6,597,258.

(51) Int. Cl.[7] ............................................. H01Q 1/38
(52) U.S. Cl. .............................. 343/700 MS; 343/853
(58) Field of Search ...................... 343/700 MS, 853, 343/876, 810, 727, 792, 756, 784, 770; 333/126, 134

(56) References Cited

U.S. PATENT DOCUMENTS

| | | | |
|---|---|---|---|
| 3,745,564 A | 7/1973 | Gandolfo et al. | 340/365 A |
| 4,282,528 A * | 8/1981 | Aspinwall | 343/727 |
| 4,427,953 A | 1/1984 | Hudspeth et al. | 333/126 |
| 4,783,639 A | 11/1988 | Hudspeth et al. | 333/126 |
| 4,785,310 A | 11/1988 | Rosen | 343/909 |
| 5,347,546 A | 9/1994 | Abadi et al. | 375/75 |
| 5,471,178 A | 11/1995 | Hickernell | 333/193 |
| 5,625,365 A | 4/1997 | Tom et al. | 343/700 MS |
| 6,188,364 B1 | 2/2001 | Scordilis | 343/202 |
| 6,597,258 B2 * | 7/2003 | Rosenbaum | 333/126 |

* cited by examiner

Primary Examiner—James Clinger
(74) Attorney, Agent, or Firm—Schmeiser, Olsen & Watts, LLP

(57) ABSTRACT

A high performance diplexer is disclosed having a common conductor which branches into two resonators in distributive form. The diplexer may be used reciprocally, has low insertion loss, is tuneable, has high signal isolation and impedance matching, and may be readily produced to meet the space requirements relating to size, temperature, radiation and performance. A method of tuning the resonators of the diplexer is also disclosed. Specific applications for the diplexer are also disclosed and include use in a GPS transmitter, GPS receiver and as part of an electronic scan array (ESA) antenna. The diplexer's small size and weight, and its resistance to the conditions of space make it ideal for use in satellite applications.

20 Claims, 7 Drawing Sheets

PHASE-ARRAY ANTENNA DIPLEXING

CROSS REFERENCE TO RELATED APPLICATIONS

This application is a divisional of the earlier patent application by Rosenbaum entitled "PCB TRACE-FORMED HIGH PERFORMANCE FREQUENCY DIPLEXER AND METHOD" Ser. No. 09/944,781, filed filed Aug. 30, 2001 now U.S. Pat. No. 6,597,258, now pending, the disclosure of which hereby incorporated herein by reference.

BACKGROUND OF THE INVENTION

1. Technical Field

This invention generally relates to devices for summing or splitting component frequencies of a signal, and more specifically to a space qualifiable, high performance diplexer configured in distributive form which works as either a summer or a splitter.

2. Background Art

A diplexer is a device which separates a received signal into two frequency ranges within the received signal. Conventional diplexers comprise discrete circuit components to bandpass, highpass or lowpass filter a received signal into two frequency ranges.

Circuitry for use on a satellite must be space qualified to withstand the rigorous conditions of the launch and of the space environment. Some considerations for space qualification include the weight and size added to a satellite by the circuit and the circuit's ability to survive extreme vibration, very wide temperature variations and the environmental and radiation contaminations of space over time. Conventionally, the manufacture of discrete components which meet the criteria set for space qualification is expensive, and discrete component elements are more likely to fail in space than elements without discrete components.

Signal filters for use in space have conventionally been fabricated using a ceramic-based diplexer. Ceramic-based diplexers include a diplexer cavity which has been laser-trimmed to tune the cavity like a wave guide to selectively pass only desired frequencies. While widely used commercially, however, ceramic-based diplexers are generally more bulky and heavy than circuit boards (about the size of a large desk phone), and are prone to damage from temperature cycles and aging. Over time, after being exposed to the extreme temperatures and conditions of space, ceramic-based diplexers tend to crack and their center frequencies tend to drift up rendering them ineffective for their intended purpose. For space applications, failed components is a particular problem because the satellites are not readily accessible for repairs and maintenance. Repair of satellite components, once in space, is expensive.

Thus, there is a need for a non-ceramic-based diplexer which is small and light weight without discrete components which can endure the rugged conditions required to qualify for space use. There is also a need for a small, high performance diplexer capable of handling high frequencies.

DISCLOSURE OF THE INVENTION

The present invention relates to a diplexer for summing or splitting a plurality of frequency bands through a plurality of distributive resonators joined by a common conductor. A specific embodiment of the invention includes a diplexer with two resonators configured and tuned to each filter one of the L1 or L2 signals and reflect the other. Through impedance matching in each of the respective resonator branches for the frequency to pass within the branch, high signal quality is maintained with low insertion loss. By using a printed circuit board with a ground plane, cross-talk is minimized. The resulting diplexer is tunable, has high signal isolation, has low insertion loss, and may be used reciprocally.

Specific applications for the invention described include use of a distributively formed diplexer within a signal receiver, a signal transmitter and an antenna array. The diplexer's small size and weight, and its resistance to radiation and environmental contamination also make it ideal for use in satellite applications, and particularly for use with GPS.

The foregoing and other features and advantages of the present invention will be apparent from the following more particular description of the particular embodiments of the invention, as illustrated in the accompanying drawings.

DETAILED DESCRIPTION OF EMBODIMENTS OF THE INVENTION

Figure 1:
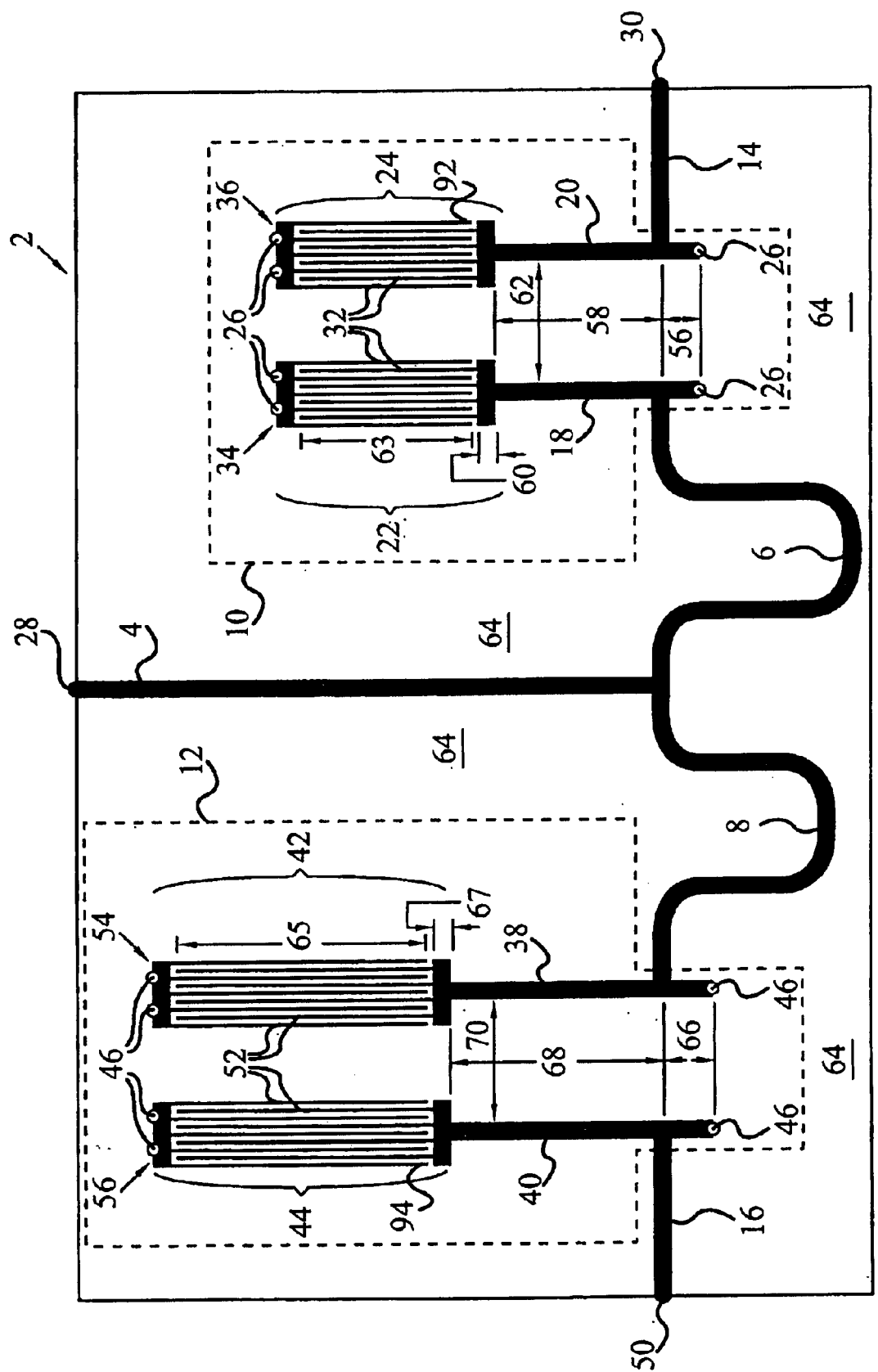
FIG. 1 is a layout diagram of a diplexer configured according to an embodiment of the present invention.

Embodiments of the present invention relate to a distributive form diplexer which may be qualified for use in space. As used herein, the term "distributive" as it refers to circuitry on a printed circuit board is intended to mean 'without discrete components' and refers to circuitry whose functionality is provided by the printed circuit board metal traces and etchings. FIG. 1 is a layout diagram of a diplexer 2 configured according to an embodiment of the present invention. The diplexer 2 includes a common path 4 which splits into first and second transfer conductors 6 and 8, first and second resonators 10 and 12, and first and second output conductors 14 and 16. The various components of the diplexer 2 may be distributively formed without discrete components by any process known in the art. In one particular embodiment, the diplexer is distributively formed by etching conductive traces in a conductive layer of copper on a surface of a printed circuit board (PCB). In this way, diplexer functionality is strictly a function of the metal etching on the PCB; enabling it to have enhanced immunity to radiation, temperature and aging concerns, and enhanced producability.

The specific embodiment of the invention shown in FIG. 1 is designed for use with two specific frequencies in a GPS system, namely, an L1 frequency of approximately 1575 MHz, and an L2 frequency of approximately 1227 MHz. However, from the description herein, it will be understood by those of ordinary skill in the art that a diplexer configured according to embodiments of this invention may be designed for use with any two frequencies, or even three or more frequencies, such as for use as a triplexer or quadraplexer. One unique advantage of the design of the present invention is that it may be used reciprocally as either a signal splitter or summer. This means that the diplexer can either receive a single signal with two frequency components at its input 28 and split the signal into its respective frequency components, or it can receive two separate signals at its outputs 30 and 50 and sum the signals into a single signal for transmitting through its input 30. To accomplish this, the diplexer either combines or separates the desired frequency components and filters out any undesired frequency components.

In FIG. 1, the first resonator 10 is designed to pass the L1 band, and the second resonator 12 is designed to pass the L2 band. Each of the first and second resonators 10 and 12, respectively, filter out all frequency bands other than the specific frequency band it is designed to pass. To accomplish this, the first resonator 10 includes first and second capacitive portions 22 and 24 comprising interdigitized conductive fingers 32, and first and second inductive portions 18 and 20. Similar to the first resonator 10, the second resonator 12 also includes first and second capacitive portions 42 and 44 comprising interdigitized conductive fingers 52, and first and second inductive portions 38 and 40. Positive reactance (i.e. inductive simulation) is produced by the inductive portions 18, 20, 38 and 40 of the resonators coupled to the ground vias 26 and 46. Negative reactance (i.e. capacitive simulation) is produced through the "open" end connects caused by the interdigitized conductive fingers 32 and 52 of the capacitive portions 22, 24, 42 and 44 also coupled to ground vias 26 and 46.

The lengths, widths and spacings of the PCB traces forming the diplexer determines the resonance frequency and bandwidth for each resonator. The relational characteristics of the capacitive portions 22, 24, 42 and 44 determines the length required for the inductive portions 18, 20, 38 and 40. The ratios between the respective capacitive elements 22, 24, 42 and 44 and the inductive elements 18, 20, 38 and 40, affect the efficiency of the resonators, and the quality of the signals emanating therefrom. Resultingly, this affects the passband insertion loss and also the out-of-band rolloff. The grounded vias 26 and 46 at the ends of the respective resonators 10 and 12 assist in forming the resonance for the pass frequencies as discussed hereinafter.

In addition to filtering undesired frequency bands, the diplexer provides a divider function with one common input 28 and two outputs 30 and 50. The common input 28 coupled to the common path 4 may be designed to match any impedance at the input. With radio frequency (RF) signals, to minimize signal reflection within a system, the characteristic impedance at key junctures within the system should match the impedance of the system termination and source. In the particular embodiments of the invention described herein, 50Ω impedance matching is used for convenience, but other impedance matching may be used depending upon the particular application of the invention. By using a common 50Ω impedance matching throughout the diplexer, the diplexer may be used reciprocally, meaning bi-directionally. The common path 4 is split into the first and second transfer conductors 6 and 8 which serpentine to their respective resonators 10 and 12. At the point at which the transfer conductors 6 or 8 meet their respective resonators 10 or 12, the impedance should be matched at the desired pass frequency band, and unmatched at the opposing resonator's pass frequency band. This will have the effect of passing the desired frequency band and reflecting the non-desired frequency band.

As is known in the art, impedance matching is a function of the environment through which a signal is to travel. For the diplexer of the present invention, this environment includes, among other things, the PCB characteristics as well as the characteristics and even the specific dimensions and paths of the traces over the PCB. The characteristics which have the greatest affect on impedance matching for the specific diplexer design shown in FIG. 1 are the thickness of the PCB, the dielectric constant of the board material, the width of the copper traces on the PCB, and the spacing between the copper traces on the PCB.

Figure 2:
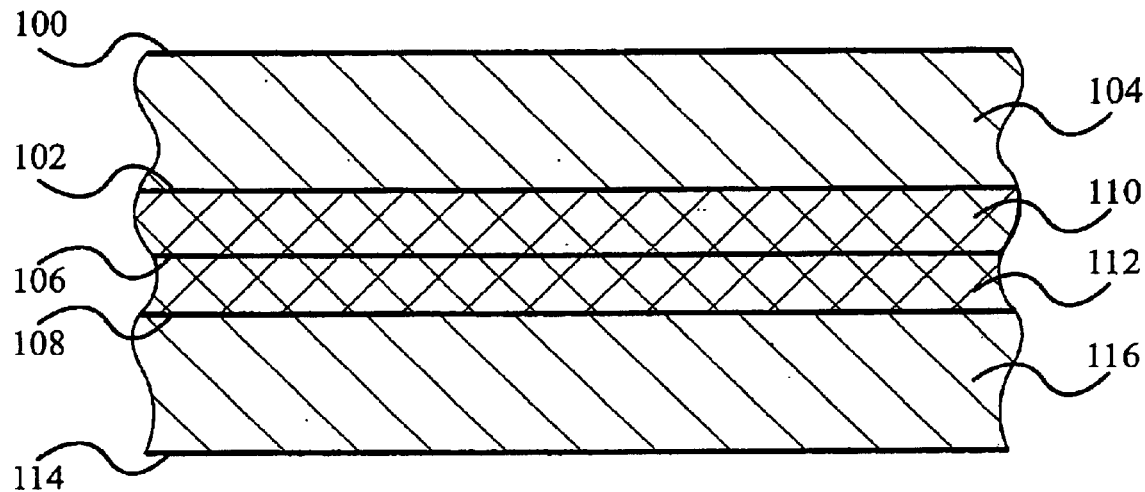
FIG. 2 is a cross-sectional view of a printed circuit board of a high performance diplexer configured according to an embodiment of the present invention.

FIG. 2 includes a cross-sectional view of a PCB for use with the diplexer configuration shown in FIG. 1 as a high performance diplexer. The PCB of FIG. 2 includes a first signal layer 100 separated from a first ground layer 102 by a first insulating layer 104 which is 30 mil thick. A second signal layer 106, or power layer, is respectively separated from both the first ground layer 102 and a second ground layer 108 by two resin-impregnated ("prepreg") layers 110 and 112, each 10 mil thick. The second ground layer 108 is separated from a third ground layer 114 by a second insulating layer 116 which is 30 mil thick. The second signal layer 106 and the first and second ground layers 102 and 108 which are conductive layers formed within the PCB are conventionally formed using a copper foil material which has a thickness of approximately 0.7 mil. Thus, the resulting thickness of the PCB is approximately 80 mil. The dielectric constant of the first and second insulating materials at 10 GHz is 9.8±0.245 with a thermal coefficient for (0 to 100)° C. of −43 ppm/° C., and a dissipation factor at 10 GHz of 0.002. A board having these properties may be obtained through the Chandler, Ariz. division of Rogers Corp., which is headquartered in Rogers, Connecticut, or through any other high performance PCB manufacturer.

By using a PCB with such a high dielectric constant, and spacing the first signal layer 100 so close to the first ground layer 102, the signals on the traces within the first signal layer 100 are restrained from radiating to the other traces and circuitry on the PCB. This minimizes cross-talk and isolates the frequency bands to enhance signal quality. It will be understood by those of ordinary skill in the art that PCB configurations other than the specific embodiment described here are also possible. For example, to reduce costs, a PCB may be used which includes only a top signal layer and a ground layer on opposing sides of the PCB, without the additional reference voltage and signal layers therebetween. The ground layers used in embodiments of the present invention are intended to supply a reference voltage and may alternatively be configured to represent reference voltages other than ground potential.

The specific dimensions of a diplexer configured according to the present invention for specific desired frequency bands may be calculated through complex impedance matching equations known in the art, or through the use of circuit simulation software such as PSPICE, MATLAB or Seranade distributed by Ansoft Corp. of Elmwood Park, N.J. Each of these software packages are generally available to the public and contain instructions on simulating and testing circuit designs. For the specific embodiment of the diplexer used for the tests described herein, appropriate conductive trace dimensions and positioning was identified using computer simulations. Thereafter, a sample PCB was etched and refinements were made using conventional design skills. The diplexer was tuned using the tuning methods disclosed herein. Given the descriptions of the invention and process provided herein, it is believed that those of ordinary skill in the art may readily design comparable diplexers for any frequency band pairs, and even design triplexers, quadraplexers, etc. for various applications.

For the specific embodiment shown in FIG. 1, designed for use with an L1 frequency band centered at approximately 1575 MHz, and an L2 frequency band centered at approximately 1227 MHz, the following is a description of the specific embodiment used to achieve 50Ω impedance matching to pass substantially only the L1 frequency band at the first resonator and substantially only the L2 frequency band at the second resonator. All of the traces are formed in a conductive layer of a PCB by standard copper etch well known in the art. The common path 4 extending from the input 28 has a width of 28.1 mil and a length of approximately 500 mil to the point where it splits into the first and second transfer conductors 6 and 8. This length is of minor consequence to the operation of the diplexer because the signal is impedance matched from the point of the paths 6 and 8 joining. In fact, in embodiments of the invention, this length is significantly shortened so that the space may be used for other circuitry. It should also be noted that the length, width and positioning of the first and second transfer conductors 6 and 8 with respect to the common path 4 and each of the resonators 10 and 12 is configured to provide minimal interaction with adjacent circuitry. This has the effect of maintaining impedance matching at each of the input 28 and two outputs 30 and 50, minimizing insertion loss degradation due to the signal splitting, minimizing cross-talk between adjacent conductors, and leaving open PCB surface area 64 between the portions of the diplexer 2 large enough to be used by other circuitry such as amplification, filtering and other kinds of signal manipulation circuitry. The signal manipulation circuitry may include any circuit component such as, for example, resistors, capacitors, transistors, inductors, integrated circuits, and other circuit traces.

The first transfer conductor 6 and its associated resonator is designed to pass the L1 frequency band and reflect the L2 frequency band. Accordingly, the first conductor 6 is 28.1 mil wide and 715 mil long to the point where it joins the first resonator 10. The two elements 34 and 36 of the first resonator 10, have substantially identical dimensions. Appropriate input and output to the resonators is accomplished by tapping close to a ground via with 50Ω traces, at a point which provides optimum impedance matching at the desired pass frequency for that resonator. Impedance matching between the resonator 10 and the transfer conductor 6, and between the resonator 10 and the output conductor 14, is a function of where the conductors 6 and 14 tap into the inductive portions 18 and 20 of the resonator 10. To optimally pass the L1 frequency band and reflect the L2 frequency band at the first resonator 10, the taps are spaced along the inductive portions 18 and 20 a distance of 35 mil (dimension 56) from the ground via connection 26 and 215 mil (dimension 58) from the bottom of the capacitive portions 22 and 24. A lower desired pass frequency would require a larger space between the tap points and the ground via 26, as indicated by the configuration of the second resonator 12.

The base of each of the capacitive portions 22 and 24 has a width of 20 mil (dimension 60) and four conductive fingers 32 extending therefrom. Five complementary interdigitized conductive fingers 32 extend from a top of each capacitive portion 22 and 24 toward its respective base. The interdigitized conductive fingers 32 are each 5 mil wide and are spaced 5 mil apart. This is presently the smallest and closest these conductive fingers may be etched using existing technology. The closer the interdigitized conductive fingers 32 are placed to each other, the wider the bandwidth of the passed frequency. The length of the overlapping portions of the interdigitized conductive fingers 32 is 200 mil (dimension 63), and is a function of the impedance and frequency matching calculations, dependant upon the length of the inductive portions 18 and 20 of the resonator 10. Signal coupling for the resonator is primarily experienced between the inductive portions 18 and 20 and is a function of the separation between them. The separation between the first and second inductive portions 18 and 20 is 170 mil (dimension 62).

The second transfer conductor 8 and its associated resonator is designed to pass the L2 frequency band and reflect the L1 frequency band. Accordingly, the second transfer conductor 8 is 28.1 mil wide and 640 mil long to the point where it joins the second resonator 12. Like the elements 34 and 36 of the first resonator 10, the elements 54 and 56 of the second resonator 12 have substantially identical dimensions to each other. To optimally pass the L2 frequency band and reflect the L1 frequency band at the second resonator 12, the conductor taps for the second transfer conductor 8 and the second output conductor 14 are spaced along the inductive portions 38 and 40 a distance of 60 mil (dimension 66) from the ground vias 46 and 285 mil (dimension 68) from the bottom of the capacitive portions 42 and 44. Like the first resonator 10, the capacitive portions 42 and 44 of the second resonator 12 include a plurality of interdigitized conductive fingers 52 extending from the 20 mil wide base (dimension 67) and the top of the respective capacitive portions 42 and 44 which are 5 mil wide and spaced 5 mil apart. The top of the capacitive portions 42 and 44 are coupled through ground vias 46. The length of the overlapping portions of the interdigitized conductive fingers 52 is 160 mil (dimension 65). The separation between the inductive portions 38 and 40 of the elements 54 and 56 of the second resonator 12 is 285 mil (dimension 70).

Figure 5:
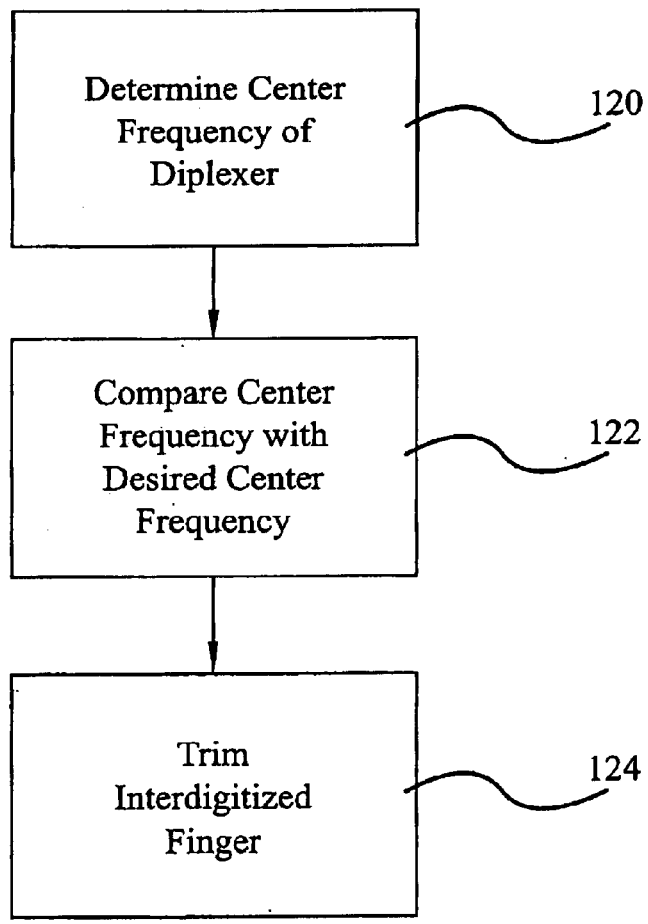
FIG. 5 is a flow chart of a method of tuning a diplexer according to an embodiment of the invention.

A diplexer configured according to the embodiment shown in FIG. 1 may be tuned after fabrication to further increase its accuracy. By trimming the outermost interdigitized conductive finger 92 on the second resonator element 36 of the first resonator 10, the impedance of the resonator may be adjusted which also adjusts the center frequency of the resonator. It was determined by trial and error for the configuration shown in FIG. 1, that trimming approximately 1.3 mil from the length of the outermost interdigitized conductive finger 92 reduced the center frequency of that resonator by approximately 1 MHz. Similarly, it was determined by trial and error that trimming approximately 2.4 mil from the length of the outermost interdigitized conductive finger 94 of the second resonator element 56 of the second resonator 12 reduced the center frequency of that resonator by approximately 1 MHz. Thus, as shown in reference to FIG. 5, a diplexer which includes a resonator having a capacitive portion with interdigitized fingers may be tuned by a method of: 1) testing the frequency response of the resonator branch to determine its center frequency (step 120); 2) comparing that center frequency with a desired center frequency (step 122); and 3) trimming one of the interdigitized conductive fingers (step 124). The process may be repeated as needed to obtain a close match to the desired center frequency for that resonator branch of the diplexer. The process may then be performed on the opposing resonator branch of the diplexer if needed.

Figure 3:
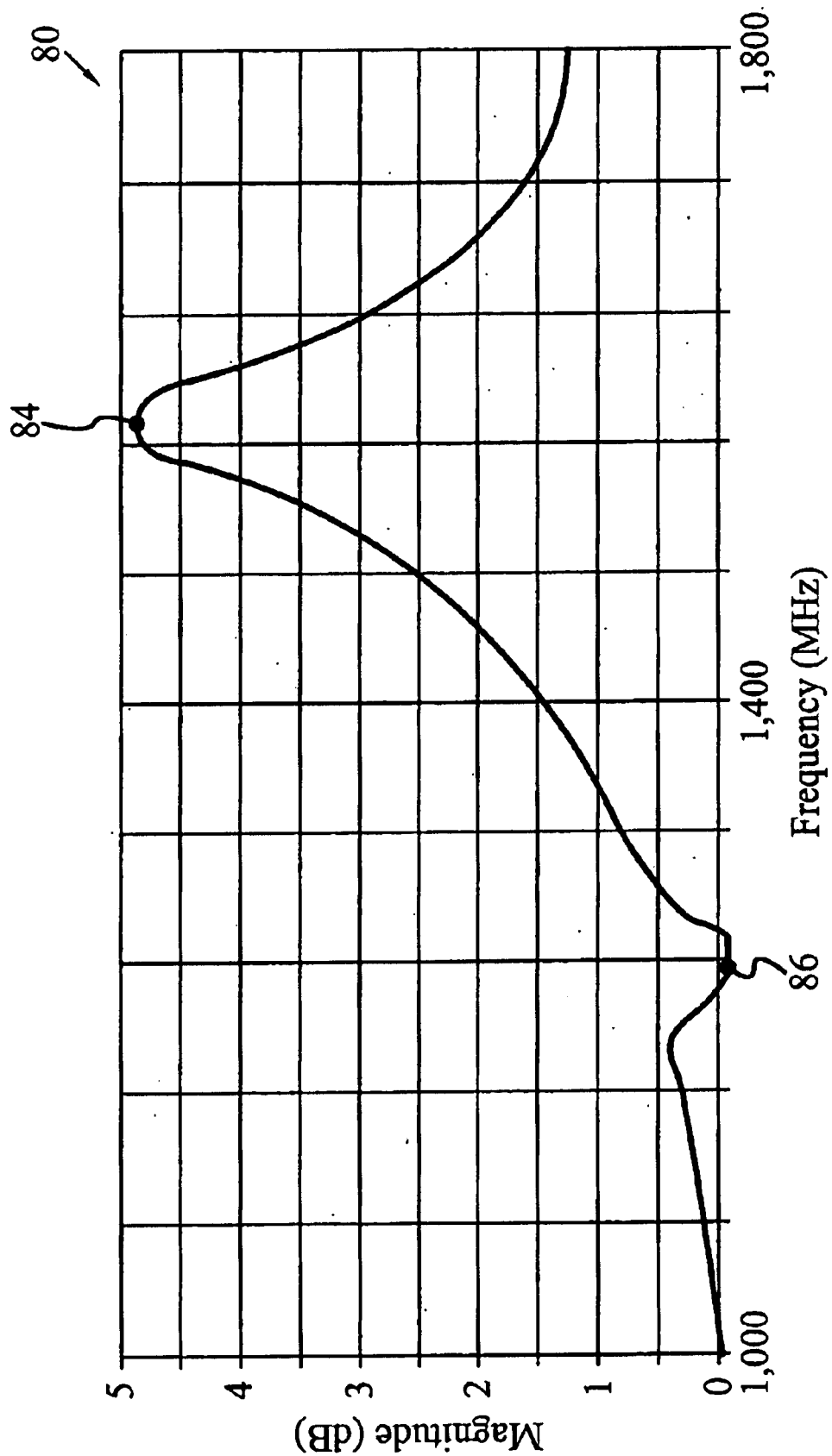
FIG. 3 is a chart of the frequency versus signal magnitude for a first branch of a diplexer configured according to an embodiment of the invention.
Figure 4:
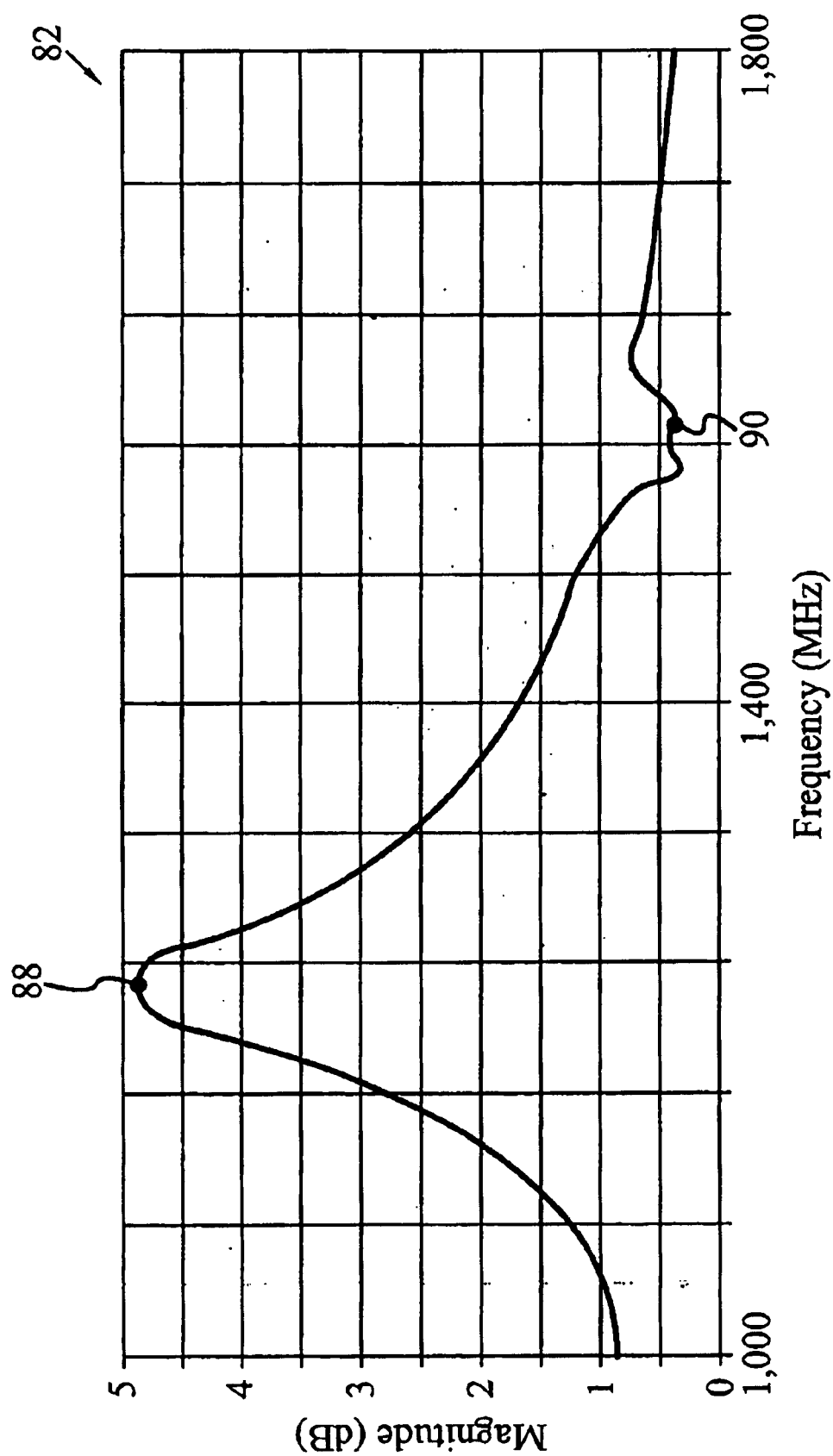
FIG. 4 is a chart of the frequency versus signal magnitude for a second branch of a diplexer configured according to an embodiment of the invention.

A conventional power splitter reduces the power at the outputs by a minimum of 3 dB, plus implementation losses. The 3 dB losses are not necessary with the present invention because substantially all of the power for each signal frequency is conveyed to its respective output, except for implementation losses. In other words, each signal is not split evenly between the two branches; in this case L1 to the first output 30, and L2 for the second output 50. FIGS. 3 and 4 illustrate actual test results for an embodiment of the diplexer configured as shown in FIG. 1. FIG. 3 includes a first signal magnitude versus frequency chart 80 for a signal measured at the first output 30. FIG. 4 includes a second signal magnitude versus frequency chart 82 for a signal measured at the second output 50. As shown in the first chart 80, the signal magnitude at the first output 30 peaks at point 84 which is placed at 1,575 MHz, and dips at point 86 which is placed at 1,227 MHz. As shown in the second chart 82, the signal magnitude at the second output 50 peaks at point 88 which is placed at 1,227 MHz, and dips at point 90 which is placed at 1,575 MHz. The tests also indicated that the bandwidth provided by the diplexer for the L1 frequency band is approximately 49 MHz, and the bandwidth provided for the L2 frequency band is approximately 45 MHz. It was found that the insertion loss degradation due to the signal splitting was only 0.2 dB, and that the isolation between ports was 50 dBc for the L2 signal at the L1 output 30, and 43 dBc for the L1 signal at the L2 output 50, confirming the high isolation of the resonators.

Figure 6:
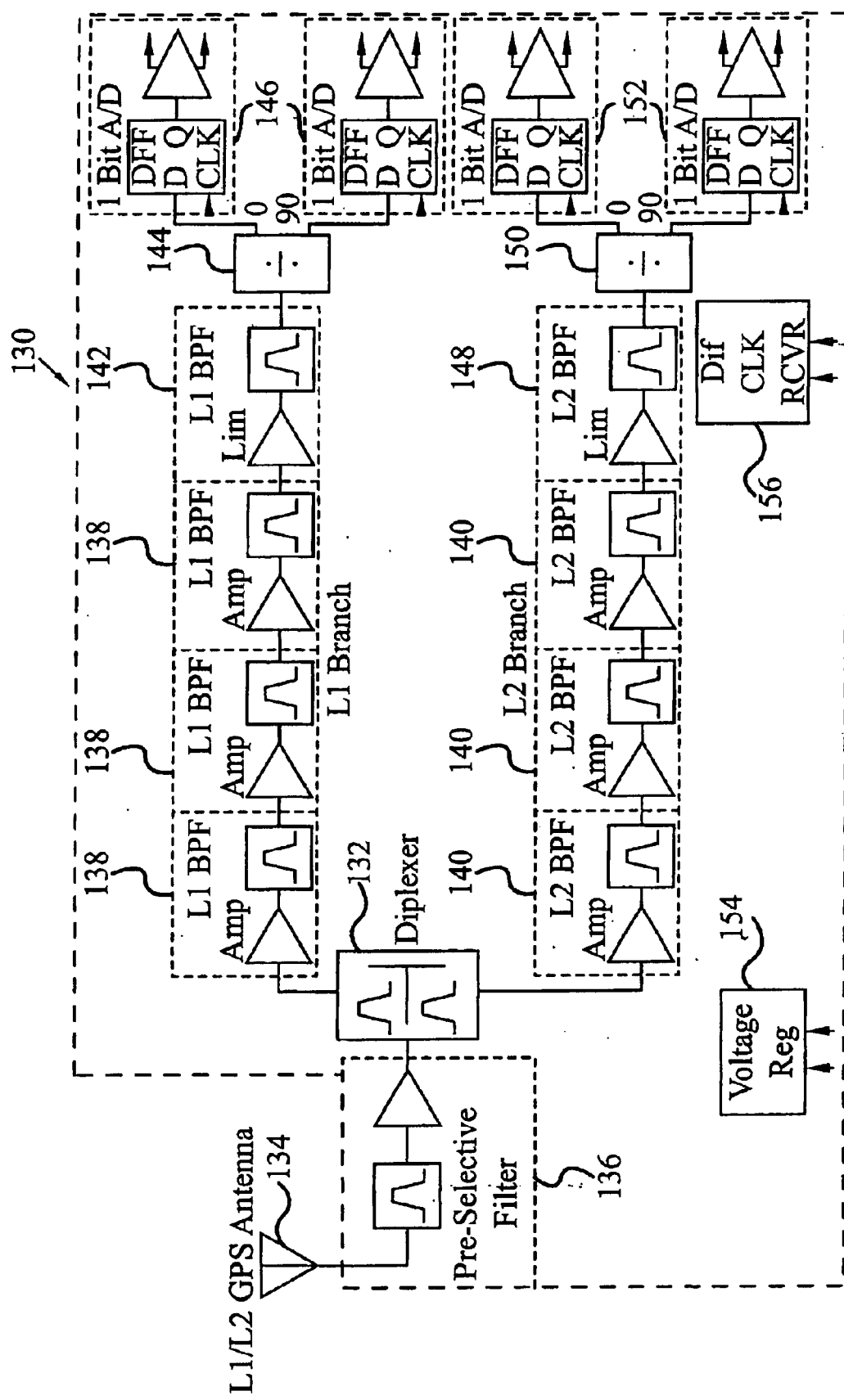
FIG. 6 is a block diagram of a GPS receiver including a diplexer configured according to an embodiment of the present invention.

FIG. 6 illustrates a portion of a GPS receiver 130 employing a diplexer 132, such as that shown in FIG. 1, configured according to an embodiment of the present invention to receive and filter a GPS signal having frequency components at each of the L1 and L2 frequencies. The receiver 130 receives the GPS signal through a GPS antenna 134 specifically tailored to receive the L1 and L2 frequency bands, and conditions the signal at pre-conditioning stage 136 by band pass filtering the signal to frequencies between 1200–1600 MHz, and amplifying that frequency range for use by the diplexer 132. The diplexer 132, as described previously, separates the received signal into its L1 and L2 frequency bands which follow the L1 and L2 branches of the receiver circuitry, respectively. En the L1 branch, the L1 frequency band of the received signal is further amplified and filtered through a plurality of stages 138 which end with a power radio frequency (RF) limiter and filtering stage 142. The resulting signal is then quadrature split at element 144. Thereafter, the signal is quantized into intermediate frequency digital bits for digital signal processing by data drivers 146. Similarly, the L2 frequency band of the received signal is further amplified and filtered through a plurality of stages 140 which end with a power RF limiter and filtering stage 148. The resulting L2 signal is then power split at element 150 before the 1 bit A/D Dif IF data drivers 152 convert the received analog L2 signal into corresponding digital data signals for use by associated circuitry. Other conventional receiver components such as a voltage regulator 154 and a clock receiver 156 are also used to drive the circuitry described. This receiver configuration may be used in a conventional GPS receiver on earth or on a satellite, or may alternatively be used in any other receiver application where a signal is received having more than one discrete frequency band which needs to be separated.

Figure 7:
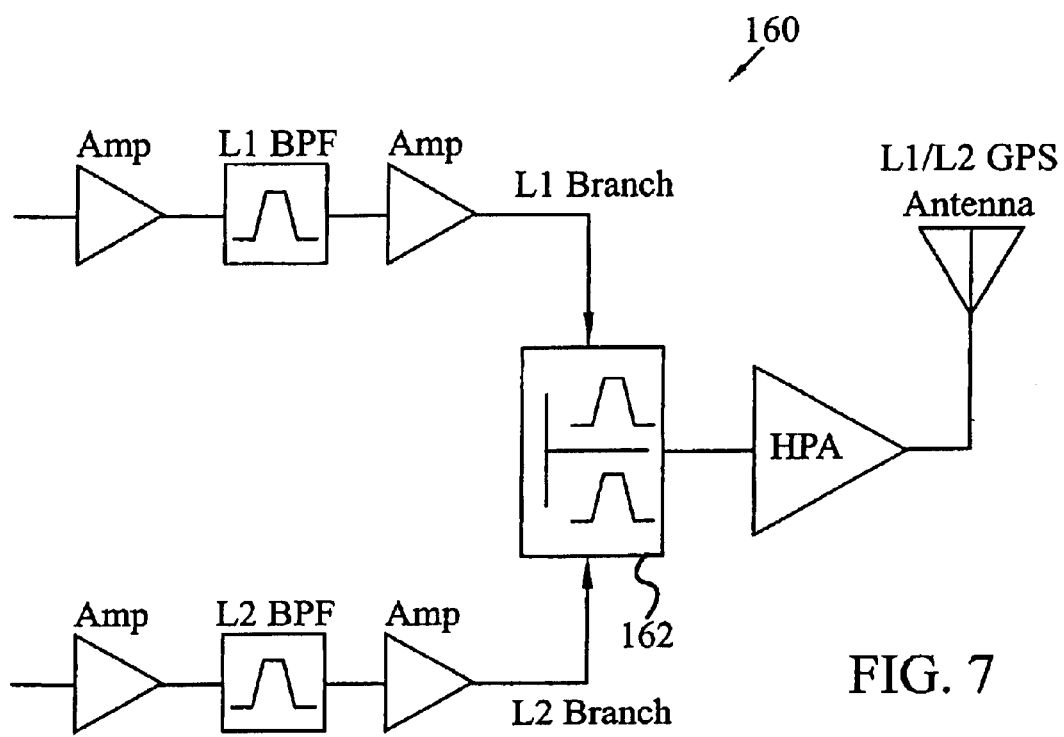
FIG. 7 is a block diagram of a first embodiment of a GPS transmitter including a diplexer configured according to an embodiment of the present invention.
Figure 8:
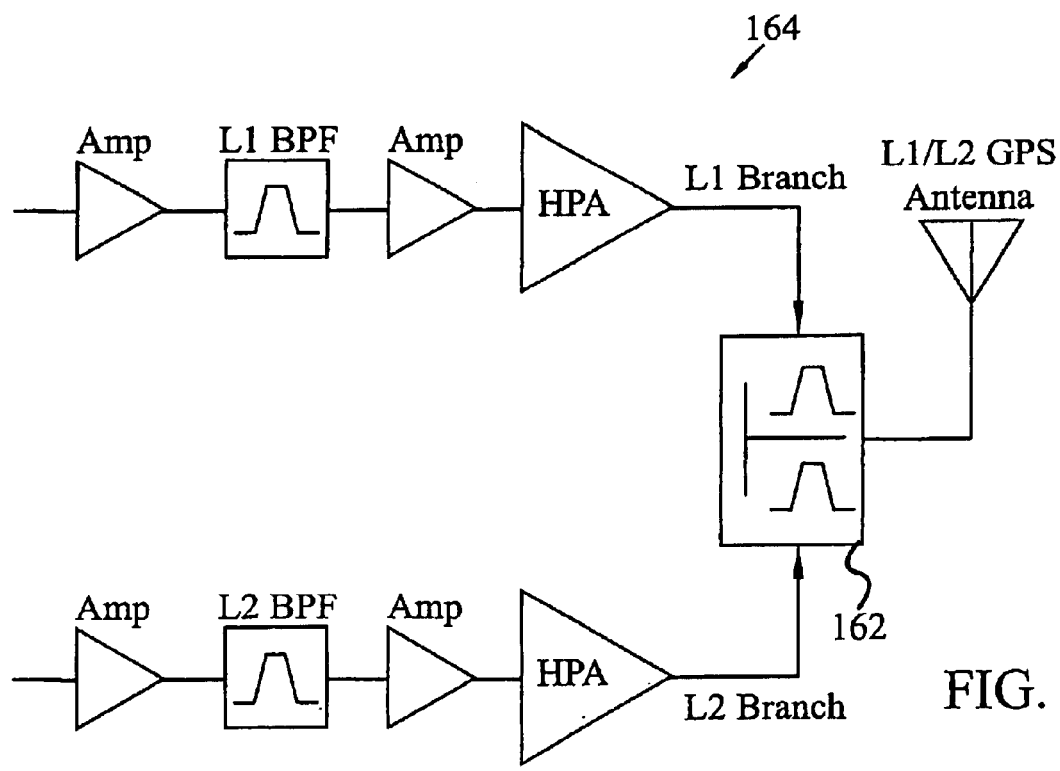
FIG. 8 is a block diagram of a second embodiment of a GPS transmitter including a diplexer configured according to an embodiment of the present invention.

As illustrated by the block diagram shown in FIG. 7, the diplexer of the present invention is not limited to receiver applications. FIG. 7 includes a block diagram of a portion of a GPS signal transmitter which includes amplification and band pass filtering for each of the L1 and L2 frequency bands to be transmitted by the transmitter 160. The resulting L1 and L2 signals are then input into a diplexer 162 configured according to an embodiment of the present invention, such as that shown in FIG. 1. With reference to the diplexer configuration of FIG. 1, the L1 and L2 signals would be input, respectively, into the first and second ports which are now inputs 30 and 50 of the diplexer. The diplexer 162 would further filter and combine the L1 and L2 frequency band signals into a common signal on the port which is now an output 28 of the diplexer of FIG. 1. With reference again to FIG. 7, the common signal having both L1 and L2 frequency band components is then further amplified for transmission through a high power amplifier (HPA) before transmitting it through a GPS Antenna specifically tailored for L1 and L2 signals. As shown in FIG. 8, two HPAs may alternatively be used prior to the diplexer 162 in a transmitter 164 to amplify the L1 and L2 frequency band signals prior to combining them.

Figure 9A:
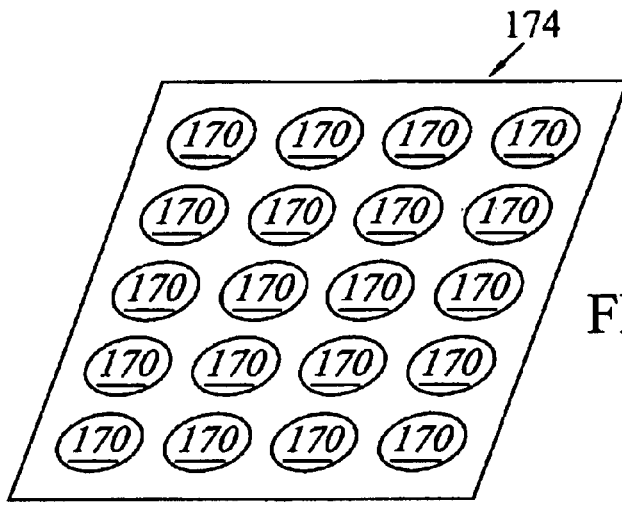
FIGS. 9a and 9b are a pictorial diagram of an Electronically Scanned Array Antenna, and a block diagram of an element of the Electronically Scanned Array Antenna including a plurality of array elements having diplexers configured according to an embodiment of the present invention.
Figure 9B:
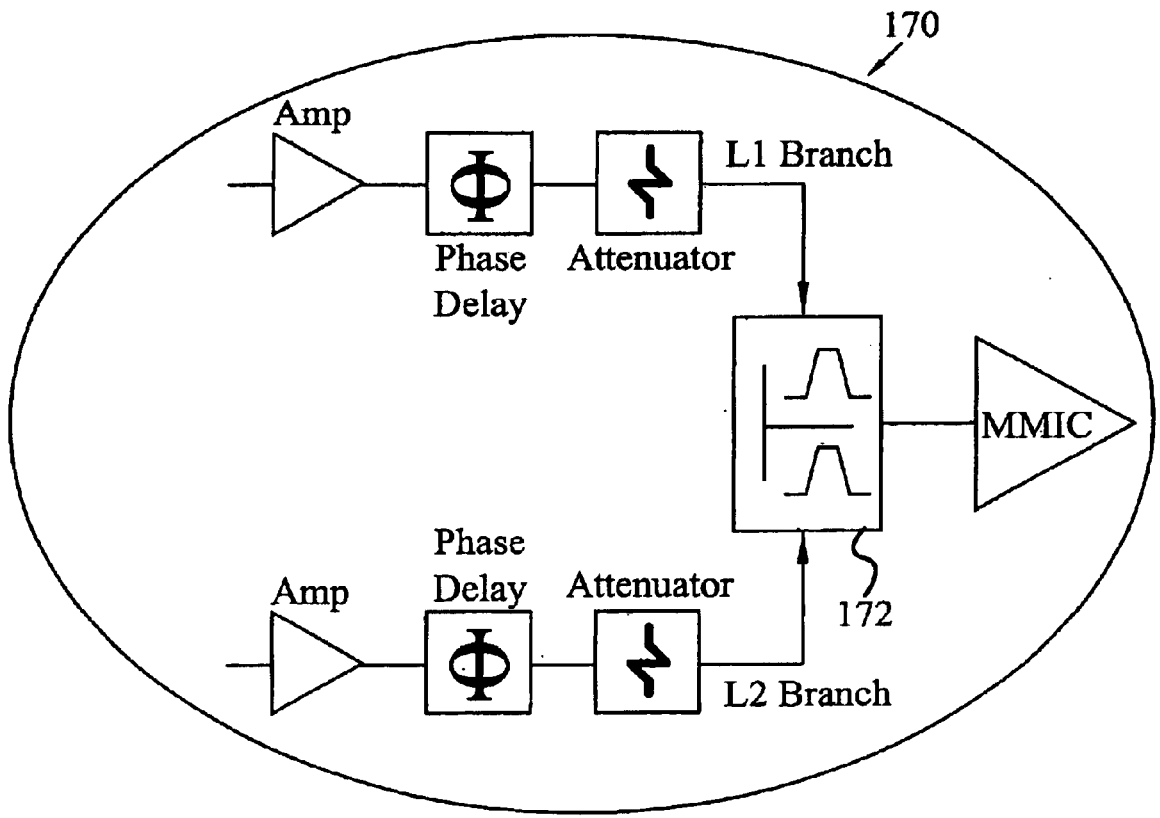

FIGS. 9a and 9b illustrate the use of a plurality of array elements 170 including diplexers 172 configured according to one or more embodiments of the present invention within an electronic scanned array (ESA) antenna 174. FIG. 9a includes a pictorial diagram of an ESA antenna 174 having a plurality of array elements 170. FIG. 9b illustrates one embodiment of an array element for use in an ESA antenna 174. The L1 and L2 signals are amplified, phase shifted, and attenuated within their respective paths as a function of associated control circuitry intended to affect the antenna beam. These two signals then provide the inputs to the diplexer. In the summation situation, the diplexer output is then amplified via MMIC (monolythic microwave integrated circuit) amplifiers. This signal then becomes one of the antenna element arrays. As shown in FIG. 9a, a plurality of the array elements 170 are included on an antenna array panel as an ESA antenna 174. An antenna array may include two or more array elements 170. For the embodiment shown in FIG. 9a, twenty antenna array elements 170 are used. In another specific embodiment of the invention, approximately 120 antenna array elements 170 are used, each comprising a diplexer configured according to an embodiment of the invention. An ESA antenna with approximately 120 antenna array elements 170 would have a length of approximately 3 meters. Alternatively, the antenna may be configured as a receiving antenna array in which case the signals would be split rather than summed by the diplexers. In both cases, the signal would be filtered.

Thus, as will be understood by those of ordinary skill in the art from the description of the invention provided herein, the diplexer configuration of the present invention includes a novel generation of microstrip diplexer resonators in distributive form which may be configured to form a space qualifiable GPS L-band diplexer in a small package with low insertion loss. Additionally, the diplexer configuration of the present invention includes a diplexer which may be used reciprocally, having a common conductor which branches to distribute the total signal to or from the resonators in a way which matches the characteristic impedances of surrounding circuitry to provide high signal quality and high signal isolation from the respective opposite resonator. Furthermore, the diplexer configuration of the present invention includes novel diplexer geometry wherein the placement of the resonators and the conductors minimizes crosstalk, minimizes the area used by the diplexer, and facilitates injection of the signal at the appropriate locations on the resonators.

The diplexer of the present invention has several applications for use in GPS hardware such as, for example, transmitters, receivers, and active antennas. Some applications employ the diplexer to sum two frequency bands of a signal, and others employ the diplexer to split two frequency bands of a signal. The diplexer also provides both filtering and isolation. Furthermore, due to its bandwidth, the diplexer is capable of accommodating a proposed wider 'M' code for the GPS. Operation of the diplexer may be accomplished at low, intermediate or high power levels with minimum environmental concerns.

In high power RF applications, there may be heating conerns, or RF 'arcing' across the inter-digital copper strips. For thermal issues, the diplexer may be configured to operate without the additional power plane or inner signal PCB multi-layers; having just a top signal plane and bottom ground plane. The ground plane side of the PCB may be mounted via thermally conductive adhesive to a heat sink material such as aluminum. For arcing, the capacitive inter-digital finger spacings may be widened. The increased spacing would need to be compensated for with an increased length or number of fingers. Also, the configuration could be placed on a PCB with a lower dielectric coefficient. This would force the inter-digital spacing to be wider, also allowing for higher RF power usage.

The diplexer is also readily designable and modifiable for use with other L-band signals (such as L3 and L5), or any other frequency band signals. This is done by changing the resonator and conductor dimensions as described herein. Additionally, the diplexer design may be used for more than two signals, such as use as a triplexer, quadraplexer, or more. This is done by extending additional serpentine conductors and adding more resonators using the principles described herein.

The diplexer also has application in an ESA antenna portion of a GPS space platform. Its low insertion loss, impedance matching, and especially small size allows integration of the diplexer in mass quantity with the monolithic microwave integrated circuits (MMICs). Also, the diplexer's immunity to environmental concerns allows it to be placed close to or actually on the antenna panel as required for a particular application.

The embodiments and examples set forth herein were presented in order to best explain the present invention and its practical application and to thereby enable those of ordinary skill in the art to make and use the invention. However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above without departing from the spirit and scope of the forthcoming claims.

What is claimed is:

1. An antenna array having a plurality of array elements, each array element comprising:

first circuitry configured to conduct a common signal comprising elements of both a first frequency band and a second frequency band;

second circuitry configured to conduct signals within the first frequency band separate from signals within the second frequency band; and a distributively formed circuit joining the first and second circuitry, the distributively formed circuit comprising:

a first branch formed primarily of at least one conductive circuit trace configured to pass signal elements within the first frequency band and reflect signal elements within the second frequency band; and a second branch formed primarily of at least one conductive circuit trace configured to and pass signal elements within the second frequency band and reflect signal elements within the first frequency band;

wherein the distributively formed circuit operates as one of a signal summer and a signal splitter.

2. The antenna array of claim 1, wherein the antenna array is configured as a transmitting antenna array and the distributively formed circuit is configured as a signal summer which receives the first and second frequency bands from the second circuitry and sums them together to form the common signal for output to the first circuitry.

3. The antenna array of claim 1, wherein the antenna array is configured as a receiving antenna array and the distributively formed circuit is configured as a signal splitter which receives the common signal from the first circuitry, and separates the signals associated with the first and second frequency bands for output to the second circuitry.

4. The antenna array of claim 1, wherein the first frequency band has a center frequency of approximately 1575 MHz and the second frequency band has a center frequency of approximately 1227 MHz.

5. The antenna array of claim 1, wherein the first and second branches of the distributively formed circuit each include a respective resonator.

6. The antenna array of claim 5, wherein each resonator comprises first and second resonator elements, each having an inductive portion and a capacitive portion having inter-digitized conductive fingers; wherein the inductive portions of the respective resonators are configured to cause an impedance at each resonator to match a characteristic impedance value at a center frequency for that resonator.

7. The antenna array of claim 1, formed on a printed circuit board having a signal layer separated from a voltage reference layer by an insulating layer, the signal layer including at least a portion of the distributively formed circuit.

8. An antenna array having a plurality of array elements, each array element comprising:

first circuitry configured to conduct a common signal comprising elements of both a first frequency band and a second frequency band;

second circuitry configured to conduct signals within the first frequency band separate from signals within the second frequency band; and at least one distributively formed circuit joining the first and second circuitry, the at least one distributively formed circuit comprising:

a first branch formed primarily of at least one conductive circuit trace configured to pass signal elements within the first frequency band and reflect signal elements within the second frequency band; and a second branch formed primarily of at least one conductive circuit trace configured to and pass signal elements within the second frequency band and reflect signal elements within the first frequency band;

wherein the distributively formed circuit operates as one of a multiple-signal summer and a multiple-signal splitter.

9. The antenna array of claim 8, wherein the antenna array is configured as a transmitting antenna array and the at least one distributively formed circuit is configured as a multiple-signal summer that receives the first frequency band and the second frequency band from the second circuitry and sums them together to form the common signal for output to the first circuitry.

10. The antenna array of claim 8, wherein the antenna array is configured as a receiving antenna array and the at least one distributively formed circuit is configured as a multiple-signal splitter that receives the common signal from the first circuitry, and separates the signals associated with the first and second frequency bands for output to the second circuitry.

11. The antenna array of claim 8, wherein the first frequency band has a center frequency of approximately 1575 MHz and the second frequency band has a center frequency of approximately 1227 MHz.

12. The antenna array of claim 8, wherein the first and second branches of the distributively formed circuit each include a respective resonator.

13. The antenna array of claim 12 wherein each resonator comprises first and second resonator elements, each having an inductive portion and a capacitive portion having interdigitized conductive fingers; the inductive portions of the respective resonators configured to cause the impedance at each resonator to match a characteristic impedance value at a center frequency for that resonator.

14. The antenna array of claim 8 formed on a printed circuit board having a signal layer separated from a voltage reference layer by an insulating layer, the signal layer including at least a portion of the distributively formed circuit.

15. An antenna array having a plurality of array elements formed on at least one printed circuit board having a signal layer separated from a voltage reference layer by an insulating layer, each array element comprising:

first circuitry configured to conduct a common signal comprising elements of both the first frequency band and the second frequency band;

second circuitry configured to conduct signals within a first frequency band separate from signals within a second frequency band; and a distributively formed circuit joining the first and second circuitry, the distributively formed circuit formed substantially in the signal layer and comprising:

a first branch comprised substantially of conductive traces configured to pass signal elements within the first frequency band and reflect signal elements within the second frequency band; and a second branch comprised substantially of conductive traces configured to and pass signal elements within the second frequency band and reflect signal elements within the first frequency band;

wherein the distributively formed circuit operates as one of a signal summer and a signal splitter.

16. The antenna array of claim 15, wherein the antenna array is configured as a transmitting antenna array and the distributively formed circuit is configured as a signal summer that receives the first and second frequency bands from the second circuitry and sums them together to form the common signal for output to the first circuitry.

17. The antenna array of claim 15, wherein the antenna array is configured as a receiving antenna array and the distributively formed circuit is configured as a signal splitter that receives the common signal from the first circuitry, and separates the signals associated with the first and second frequency bands for output to the second circuitry.

18. The antenna array of claim 15, wherein the first frequency band has a center frequency of approximately 1575 MHz and the second frequency band has a center frequency of approximately 1227 MHz.

19. The antenna array of claim 15, wherein the first and second branches of the distributively formed circuit each include a respective resonator.

20. The antenna array of claim 19 wherein each resonator comprises first and second resonator elements, each having an inductive portion and a capacitive portion having interdigitized conductive fingers; wherein the inductive portions of the respective resonators are configured to cause an impedance at each resonator to match a characteristic impedance value at a center frequency for that resonator.

* * * * *